US006777660B1

(12) United States Patent
Lee

(10) Patent No.: US 6,777,660 B1
(45) Date of Patent: Aug. 17, 2004

(54) CMOS ACTIVE PIXEL WITH RESET NOISE REDUCTION

(75) Inventor: Hae-Seung Lee, Bedford, MA (US)

(73) Assignee: SMaL Technologies, Cambridge, MA (US)

( * ) Notice: Subject to any disclaimer, the term of this patent is extended or adjusted under 35 U.S.C. 154(b) by 0 days.

(21) Appl. No.: 10/067,554

(22) Filed: Feb. 4, 2002

(51) Int. Cl.[7] .............................................. H01L 27/00
(52) U.S. Cl. .............................. 250/208.1; 250/214 AG; 348/308
(58) Field of Search .......................... 250/208.1, 206, 250/200, 214 AG, 214 A, 214 R; 348/308, 300, 241; 330/308, 250

(56) References Cited

U.S. PATENT DOCUMENTS

| | | |
|---|---|---|
| 5,572,074 A | 11/1996 | Standley |
| 5,698,844 A | 12/1997 | Shinohara et al. |
| 5,714,909 A | 2/1998 | Jackson |
| 5,880,460 A * | 3/1999 | Merrill ..................... 250/208.1 |
| 5,892,540 A | 4/1999 | Kozlowski et al. |
| 5,962,844 A | 10/1999 | Merrill et al. |
| 5,969,758 A | 10/1999 | Sauer et al. |
| 6,130,423 A | 10/2000 | Brehmer et al. |
| 6,163,024 A | 12/2000 | Kozuka et al. |
| 6,169,317 B1 | 1/2001 | Sawada et al. |
| 6,191,412 B1 | 2/2001 | Afghahi |
| 6,204,524 B1 | 3/2001 | Rhodes |
| 6,218,656 B1 | 4/2001 | Guidash |
| 6,438,276 B1 * | 8/2002 | Dhuse et al. ................ 382/312 |
| 6,532,040 B1 * | 3/2003 | Kozlowski et al. .......... 348/241 |

* cited by examiner

Primary Examiner—Thanh X. Luu
Assistant Examiner—Seung C Sohn
(74) Attorney, Agent, or Firm—Theresa A. Lober

(57) ABSTRACT

A CMOS image sensor array has rows and columns of active pixels. In addition, there are one or more column lines each cooperating with the active pixels in the respective columns. Each active pixel has an output connected to a column line. Each active pixel includes a photodiode that produces a signal proportional to incident light intensity. The proportional signal is applied to the active pixel output if the column select and row select are appropriately set. In addition, each active pixel has a reset transistor for resetting the active pixel. Each reset transistor has a gate and first and second terminals. A reset voltage is applied to the gate of each reset transistor to cause a reset.

The CMOS image sensor array also has one or more amplifiers. Each amplifier has a first input connected to a different column line. Each amplifier provides a negative feedback output to the first node of each reset transistor of the active pixels for the respective cooperating column line. An reset reference voltage is applied to a second input of each amplifier to adjust the negative feedback to adjust the voltage at the second node of each reset transistor to a desired reset voltage. The second node of each reset transistor cooperates with the first input of the respective amplifier for the column.

40 Claims, 7 Drawing Sheets

CMOS ACTIVE PIXEL WITH RESET NOISE REDUCTION

BACKGROUND OF INVENTION

1. Field of the Invention

The invention relates to a CMOS image sensor array design that is capable of substantially reducing reset noise. More specifically, the invention relates to an array of active pixels having rows and columns with one amplifier for each column to produce a feedback to the reset transistors of the respective column to reduce noise.

2. Description of the Related Art

CMOS image sensors are attractive due to the compatibility with VLSI circuits. However, CMOS imagers have typically higher noise than CCD imagers. While CCD imagers employ correlated double-sampling (CDS) to remove the reset noise commonly referred to as kTC noise, the operation of most CMOS imagers does not allow true CDS. Instead, uncorrelated double-sampling is employed to remove the constant reset level. Unfortunately, this method actually increases reset noise.

Prior art CMOS pixel designs disclose correlated-doubling sampling incorporated in the pixel design. Although this circuit substantially removes the reset noise, an amplifier and two additional devices are necessary within each pixel to provide the CDS function, greatly increasing the area of the pixel. What is needed is a CMOS image sensor array design where each active pixel in the image sensor array does not need a separate amplifier.

SUMMARY OF THE INVENTION

A CMOS image sensor array has rows and columns of active pixels. In addition, there are one or more column lines each cooperating with the active pixels in the respective columns. Each active pixel in a column has an output connected to the column line. Each active pixel includes a photodiode that produces a signal proportional to incident light intensity. The proportional signal may be current, voltage, or charge. The proportional signal is applied to the active pixel output if the column select and row select are appropriately set. In addition, each active pixel has a reset transistor to reset the pixel. Each reset transistor has a gate and first and second terminals. A reset voltage is applied to the gate of each reset transistor to reset the transistors.

The CMOS image sensor array also has one or more amplifiers. Each amplifier has a first input connected to the column line. Each amplifier also provides a negative feedback output to the first terminal of each reset transistor of the active pixels for the respective cooperating column line. A reset reference voltage is applied to a second input of each amplifier to adjust the negative feedback to set the voltage at the second terminal of each reset transistor to a desired reset voltage. The second terminal of each reset transistor cooperates with the first input of the respective amplifier for the column.

The voltage at each said second terminal is $V_T \Delta V$ below the reset voltage, where $\Delta V$ keeps the reset transistor in the subthreshold region in the steady state of the reset phase. The $\Delta V$ typically exceeds one hundred millivolts.

The CMOS image sensor array has one or more row lines each cooperating with the active pixels in a row. Each active pixel in the row has a row select transistor coupled between its respective second terminal and the first input of the respective amplifier.

The CMOS image sensor array further has a source follower transistor coupled between the second terminal and the row select transistor of each active pixel.

The first advantage of the present invention is that it provides a CMOS imager design that is capable of substantially reducing the reset noise.

A second advantage of the present invention is that it provides a reset noise reduction without substantially increasing the complexity of the pixel. More specifically, the present invention avoids the inclusion of an amplifier in each pixel.

DETAILED DESCRIPTION OF THE INVENTION

Figure 1:
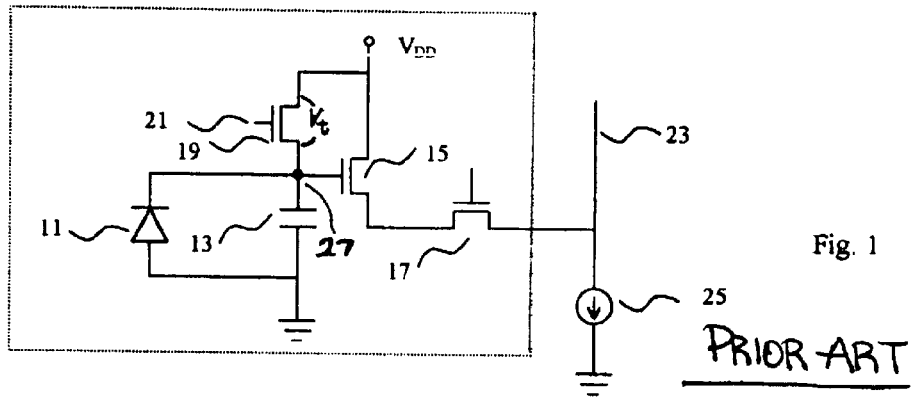
FIG. 1 shows a schematic drawing of a prior art standard active pixel.

FIG. 1 shows a schematic diagram of a standard active pixel. A first circuit, for example, a photocircuit such as a photodiode 11 produces a current proportional to the incident light intensity. The photocircuit could alternatively produce a proportional voltage or charge. The resulting photocurrent is integrated on a charge sensing capacitor 13. The charge-sensing capacitor 13 may be any source of capacitance, but is typically a parasitic reverse-biased PN junction capacitance associated with the photodiode 11 itself A MOS transistor 15 operates as a source follower that buffers the voltage on the capacitor 13 nondestructively to a column line 23. A row select MOS switch 17 activates the source follower transistor 15 when the particular row is selected. When the pixel is reset, the gate 21 of the reset transistor 19 is brought up to, typically, Vdd. The charge sensing capacitor 13 is reset to approximately Vdd-Vt where Vt is the threshold voltage of reset transistor 19. The reset level contains error from pixel to pixel. The error has two components. The first component is fixed error due to mismatches in Vt and transistor sizes. The other component is the random reset noise on the order of $$\sqrt{\frac{kT}{C}}$$

where C is the charge sensing capacitor 13. There are two different modes of reset; hard reset and soft reset. In hard reset, the gate of the rest transistor is pulled up more than Vt higher than the drain voltage. In this mode, the reset transistor behaves as a resistor producing thermal noise. In soft reset, the gate of the reset transistor is held at a lower potential so that the reset transistor behaves as a diode, producing shot noise. It has been shown that hard reset modes produce random noise on the order of $$\sqrt{\frac{kT}{C}}$$

while soft reset contributes.

$$\sqrt{\frac{kT}{2C}}.$$

Since they differ only by a small amount, only hard reset is considered for simplicity in the following anaylsis. During reset, the reset transistor 19 behaves as a resistor with resistance value R that depends on the size of the transistor, the threshold voltage $V_T$, and the gate drive. The thermal noise spectral density of a resistor with a value R is given by $$S_R(f) = 4kTR \tag{1}$$

Since the resistor R and the capacitor C constitute a low-pass filter, the noise spectral density at Node 1 (i.e. first node) (27) is $$S_1(f) = 4kTR \cdot \frac{1}{1 + (2\pi fRC)^2} \tag{2}$$

The mean square noise at Node 1 (27) is found by integrating $S_1(f)$ over frequency;

$$\overline{v}_1^2 = \int_0^\infty S_1(f)\,df = 4kTR \int_0^\infty \frac{1}{1+(2\pi fRC)^2}\,df \tag{3}$$

$$\text{Since } \int_0^\infty \frac{1}{1+(2\pi fRC)^2}\,df = \frac{1}{4RC}, \tag{4}$$

Giving the mean-square noise $$\overline{v}_1^2 = \frac{kT}{C} \tag{5}$$

The rms value of the reset noise is thus $$\sqrt{\frac{kT}{C}}.$$

For a typical sense capacitor value of 10 fF, the rms noise $\overline{V}_1$=643 $\mu$V at room temperature.

In principle, both the fixed and random error components can be removed by correlated double sampling (CDS). In CDS, the pixel voltage is first measured immediately following the reset. This measures the reset level error including both components. The first measurement (the reset value) is stored in either analog of digital form. After the integration period, the pixel voltage is remeasured. Since the pixel is not reset again before the second measurement, the second measurement contains the same error components introduced upon reset plus change in voltage in response to light. The first measurement is subtracted from the second measurement (the integrated value) leaving only the light response term, thus removing the errors. One drawback of CDS is that the first measurement must be stored for the duration of the integration period. Since the integration period can approach the frame period, the storage circuit must be able to hold the value for this period. For a typical 30 frames/s imager, the maximum storage period is 33 ms. Analog sample-and-hold circuits would require large hold capacitors to achieve such a long hold time. Moreover, since each pixel's reset value must be stored, CDS requires the reset values for the entire array of pixels be stored. A frame buffer is thus necessary. An analog frame buffer requires a large amount of chip area and power consumption. For this reason, most frame buffers are digital. Digital frame buffers also consume large chip area and are expensive.

To circumvent the problems associated with the CDS, most CMOS imagers employ UDS (uncorrelated double sampling). In this method, the reset measurement corresponding to the next frame is subtracted instead of the reset measurement of the current frame. Since the reset for the next frame occurs immediately after the second measurement of the current frame, there is no need for long storage of measurements. Typically, the measurements are held in capacitors in switched-capacitor subtractor. Although UDS removes the fixed error due to Vt and transistor size mismatches, is does not reduce the random kT/C reset noise. This is because the reset noise introduced during the reset for the next fire is not correlated with the reset noise of the current frame. Since two uncorrelated noise quantities are present after the subtraction, UDS actually increases total reset noise power by a factor of two.

Figure 2:
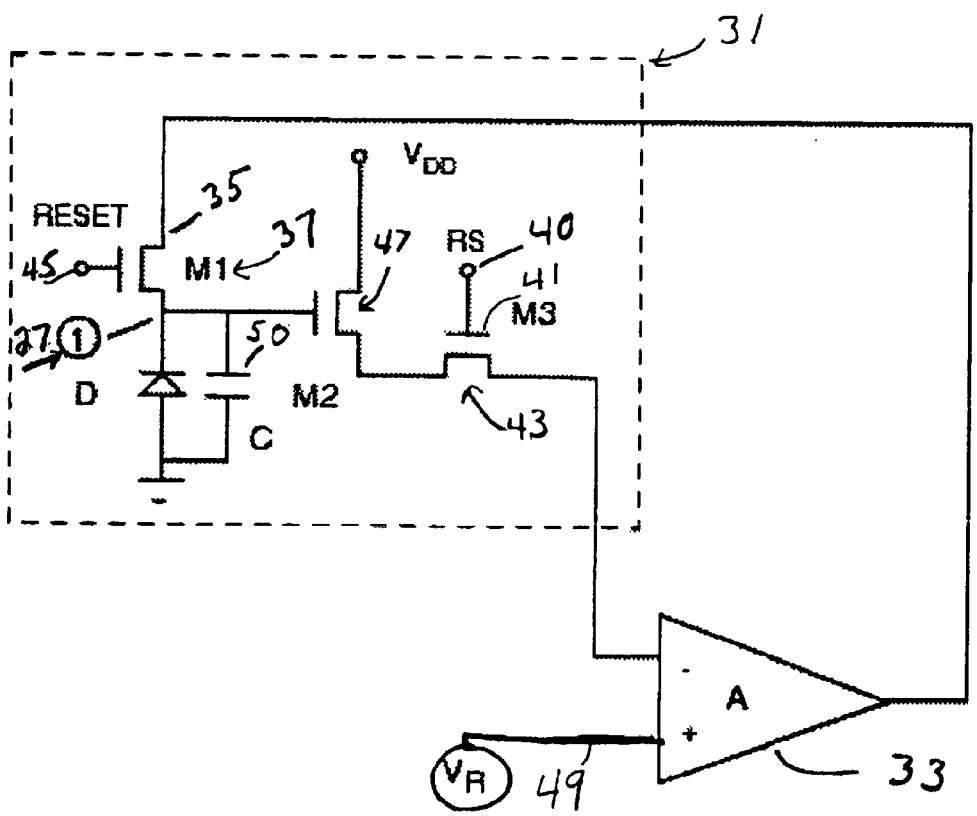
FIG. 2 shows a schematic drawing of an active pixel and amplifier according to the present invention.

FIG. 2 shows a pixel 31 and an amplifier 33 according to the present invention. Amplifier 33 may, for example, be a differential amplifier. The dashed line represents the pixel 31.

Referring to FIG. 2, the structure of pixel 31 is identical to the standard pixel in FIG. 1, except the first terminal 35 (i.e. drain) of the reset transistor M1 (37) is connected to the output of the amplifier A (33) instead of $V_{DD}$. The second terminal of reset transistor M1 (37) is the source and is the same as NODE 1 (27). The first and second terminals 35 and 27 being designated as a drain or source may be interchanged depending on the transistor type and design. During the reset phase, the select signal RS 40 (i.e. in this case a row select signal) on the gate 41 of row select transistor M3 (43) is brought high typically to $V_{DD}$, and a reset voltage $V_{RESET}$, typically $V_{DD}$, is applied to RESET (i.e. gate 45 on reset transistor 37). The loop consisting of the amplifier A (33), M1(37), and the source follower M2 (47) and the row select transistor M3 (43) is a unity-gain loop. The voltage $V_R$ (i.e. reset reference voltage) applied to the non-inverting input 49 of the amplifier A (33) is determined such that Node 1 (27) is servoed to a voltage $V_T-\Delta V$ below the reset voltage by the negative feedback loop (i.e. output of amplifier 33 to drain 35 of reset transistor 37). $\Delta V$ is on the order of a few hundred millivolts in order to keep M1 (37) in the subthreshold region in the steady-state of the reset phase. It can be shown that the required $V_R = V_{RESET} - (V_T - \Delta V) + V_{GS2} + V_{DS3}$ (where $V_{GS2}$ is the gate to source voltage for source follower M2 (47) and $V^{DS3}$ is the drain to source voltage for row select transistor M3 (43). Since M1 (37) is in subthreshold region, its drain-to-source resistance rd1 is very large. Therefore, the dominant pole in the feedback loop is determined by $r_{ds1}$ and the pixel capacitance C (50). The amplifier A (33) preferably has much wider bandwidth than the dominant pole frequency so as not to compromise the stability of the loop. Once the pixel reaches a steady-state, RESET (45) is pulled down, sampling and holding the voltage at Node 1 (27).

Figure 3:
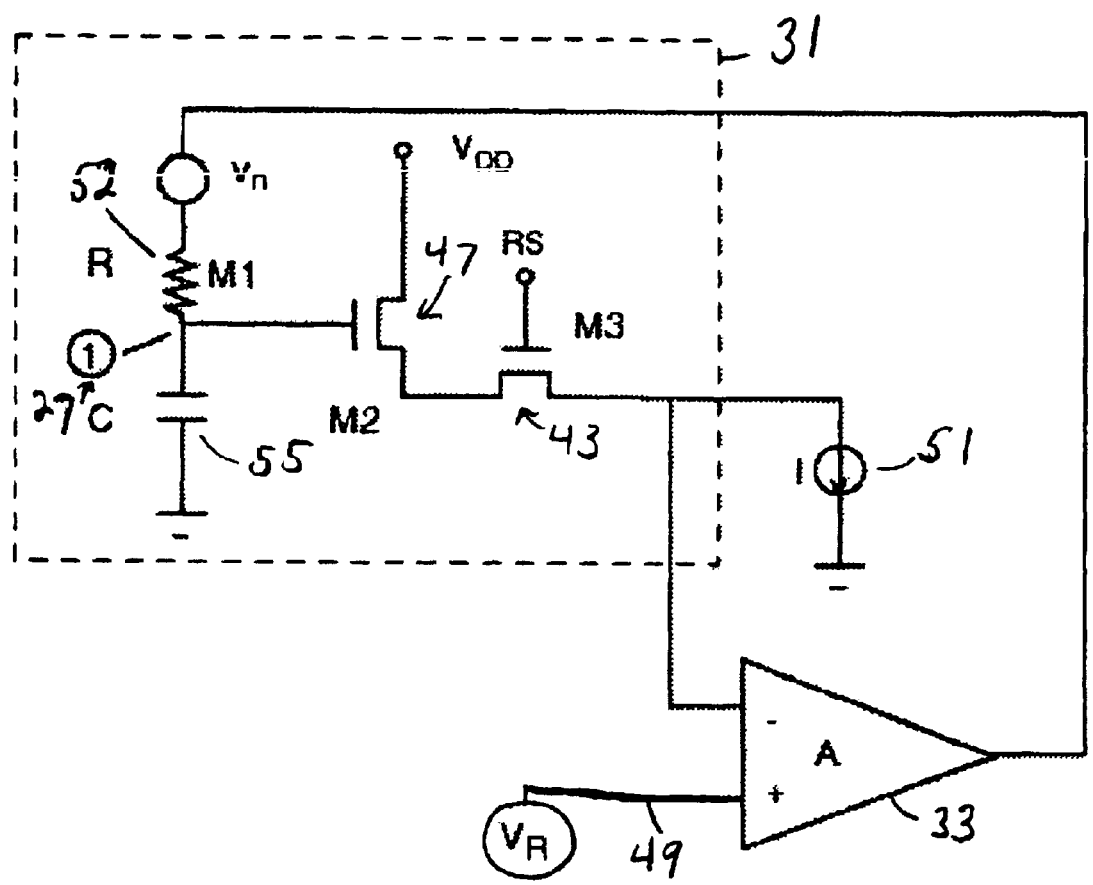
FIG. 3 shows a schematic drawing of the equivalent circuit of FIG. 2 for noise analysis.

Ideally, this voltage would be equal to $V_{RESET}-(V_T-\Delta V)$. However, when M1 (37) is turned off, charge is injected from M1 (37) to C (50) resulting in an offset voltage. This constant offset voltage is of little concern as long as its value is the same pixel-to-pixel. There is a small variation of charge injection due to mismatches in transistor and capacitor sizes. Such variation is typically random and below the typical noise floor, and thus is not noticeable, or can be cancelled by a number of techniques. Thermal noise sampled on Node 1 (27) is greatly reduced by the feedback loop. FIG. 3 illustrates the equivalent circuit for the noise analysis. The transistors produce thermal noise with spectral density as before, $$S_R(f)=4kTR \qquad (6)$$

For simplicity of analysis, we assume that M2, M3, and I (51) behave as an ideal source follower with unity gain and no noise. Since both the amplifier and the source follower have large capacitive loads, noise in these circuits can be ignored in practice. Using node analysis, the voltage at Node 1 (27) is calculated to be $$v_1 = \frac{v_n}{1+A} \qquad (7)$$

were A is the gain of amplifier A (33)
Thus, noise spectral density of $v_1$ is;

$$S_1(f) = \frac{S_R(f)}{(1+A)^2} = \frac{4kTR}{(1+A)^2} \qquad (8)$$

The mean square value of noise voltage at Node 1 (27) can be computed by integrating the noise spectral density over the bandwidth determined by R (52) and C (55);

$$\overline{v_1^2} = \int_0^\infty \frac{4kTR}{(1+A)^2} \cdot \frac{1}{1+(2\pi fRC)^2} df = \frac{1}{(1+A)^2} \frac{kT}{C} \qquad (9)$$

When the reset switch M3 (43) is turned off, the mean-square reset noise sampled is identical to (9). Compared with the standard reset noise in (5), the mean-square noise is reduced by a factor of $(1+A)^2$, the rms noise by $(1+A)$. For moderate gain A of 9 for example, the reset noise is reduced by a factor of 10. Compared with UDS, the noise reduction corresponds to a factor of $10\sqrt{2}\approx 14$. The additional factor of $\sqrt{2}$ is due to doubling of noise power in standard UDS.

Figure 4A:
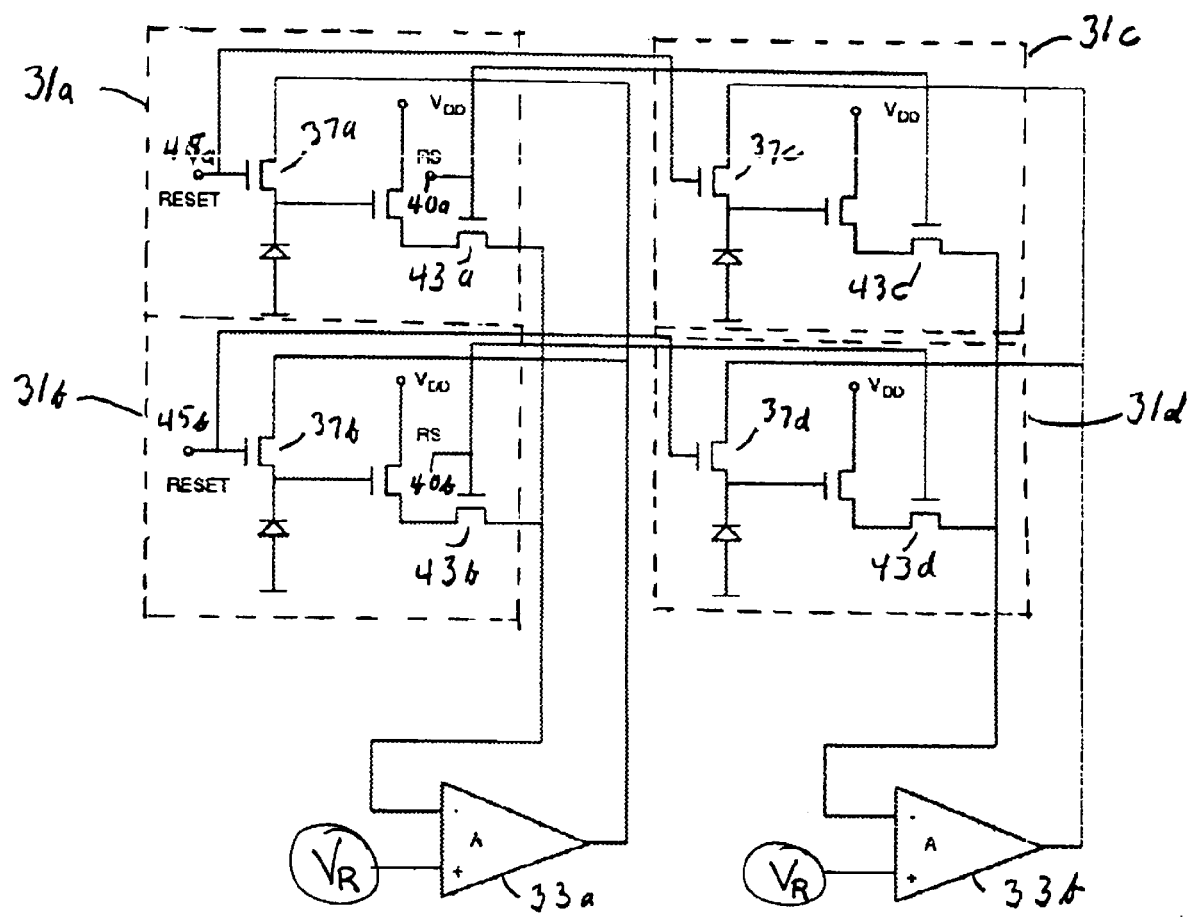
FIG. 4a shows a schematic drawing of the arrangement of pixels, amplifiers, and various signals in an 2×2 array of pixels with a column feedback arrangement.

A 2×2 pixel example is shown in FIG. 4a in order to illustrate the arrangements of pixels, amplifiers, and various signals in an array of pixels. Pixels 31a and 31b receive the output from amplifier 33a at one terminal of reset transistors 37a and 37b. Similarly, pixels 31c and 31d receive the output from amplifier 33b at one terminal of reset transistors 37c and 37d. The output of pixels 31a and 31b (i.e. from row select transistors 43a, 43b respectively) are provided to one input of differential amplifier 33a. The output of pixels 31c and 31d (i.e. from row select transistors 43c, 43d respectively) are provided to an input of differential amplifier 33b. Reset 45a is provided to the gates of reset transistors 37a and 37c. Reset 45b is provided to the gates of reset transistors 37a and 37d. Row select signal 40a is provided to row select transistors 43a and 43c. Row select signal 40b is provided to row select transistors 43b and 43d.

Figure 4B:
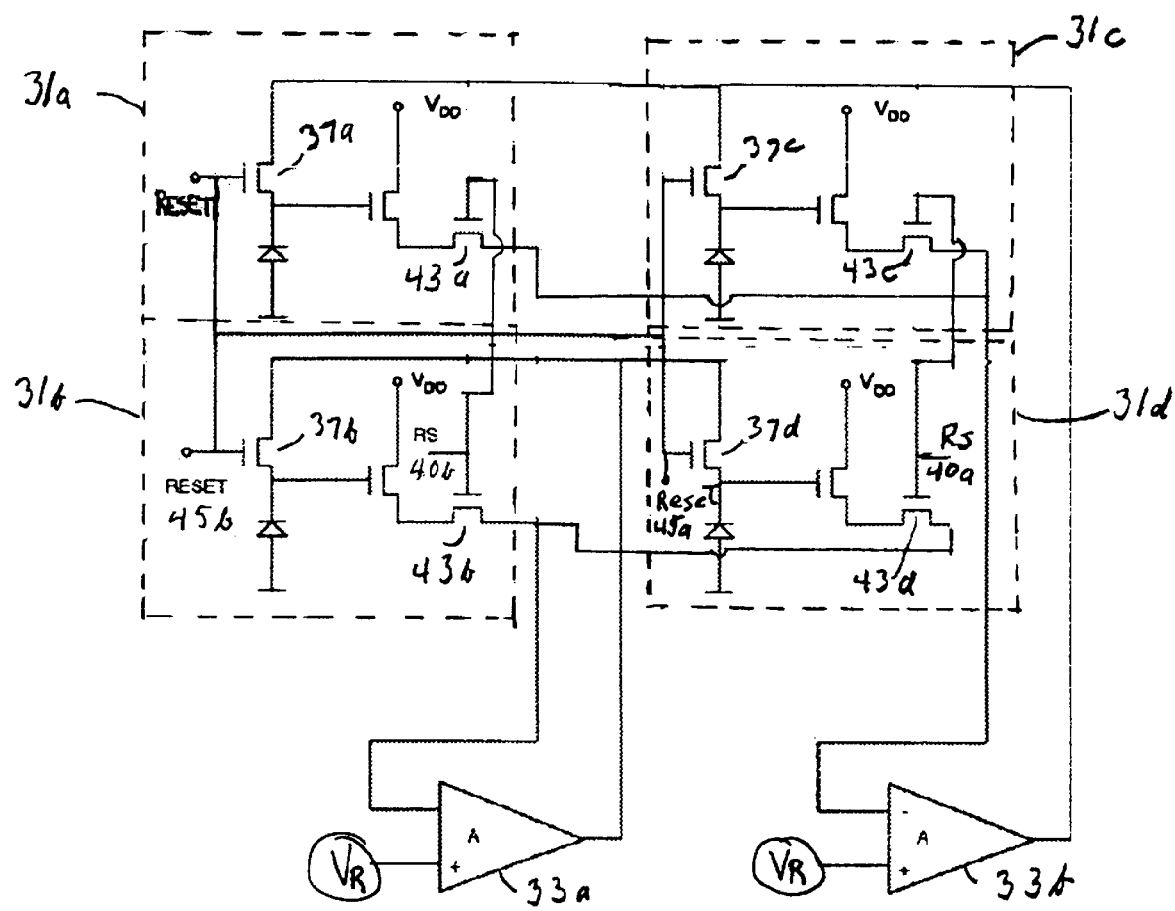
FIG. 4b shows a schematic drawing of the arrangement of pixels, amplifiers and various signals in an 2×2 array of pixels with a row feedback arrangement.

It would be within the skill of the art to interchange the rows and columns and their respective circuit array designs shown in FIG. 4a. FIG. 4b shows an array with the rows and columns interchanged. Pixels 31b and 31d receive the output from amplifier 33a at one terminal of reset transistors 37a and 37d. Similarly, pixels 31a and 31c similarly receive the output from amplifier 33b at one terminal of reset transistors 37a and 37c. The output of pixels 31b and 31d (i.e. from column select transistors 43b, 43d respectively) are provided to one input of differential amplifier 33a. The output of pixels 31a and 31c (i.e. from column select transistors 43a, 43c respectively) are provided to a second input of differential amplifier 33b. Reset 45b is provided to the gate of reset transistors 37a and 37d. Reset 45a is provided to the gate of reset transistors 37c and 37d. Column select signal 40b is provided to row select transistors 43a and 43b. Row select signal 40a is provided to row select transistors 43c and 43d.

Figure 5:
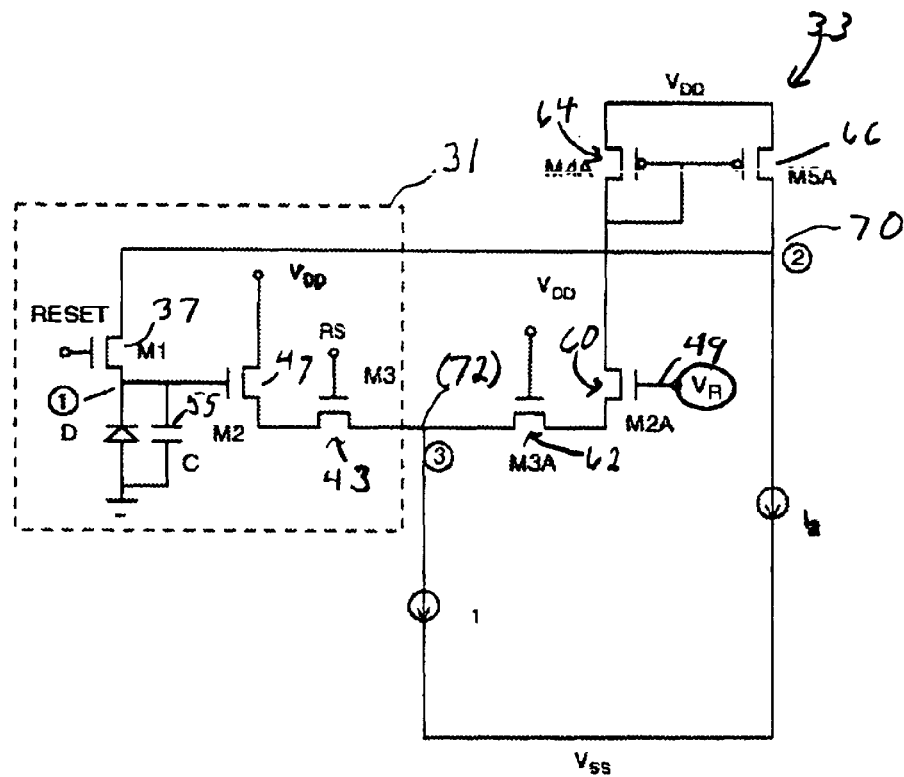
FIG. 5 shows a schematic drawing of one embodiment of the amplifier of the invention shown in FIG. 2.

FIG. 5 shows one embodiment of the amplifier A (33) with a differential input. The amplifier includes the circuitry shown outside pixel 31. The left half of the differential input of amplifier A (33) is made up of transistors M2 (47) and M3 (43) inside pixel (31). The source of M3 (43) is connected to Node 1 through M3 (43) when the row select RS of transistor M3 (43) is high for this row. The right half of the differential input consists of $V_R$ (49), which is applied to the gate of tansistor M2A (60) (i.e. second differential amplifier input transistor) in series with transistor M3A (62). M3 (43) and M3A (62) function as source degeneration resistors for the differential input pair consisting of M2 (47) and M2A (60). The current through M2A is mirrored by the current mirror comprising M4A (64) and M5A (66). The output of the amplifier, Node 2 (70), is connected to the drain of reset transistor M1 (37) in the manner described above in conjunction with FIG. 2. In order for the feedback loop to be stable, the frequency of the dominant pole that is determined by the on-resistance of M1 (37) and the sense capacitor C (55) must be lower at least by a factor of gain A compared with non-dominant poles. The non-dominant poles are given by the Thevenin resistance and the parasitic capacitance at Node 2 (70), and those sit Node 3 (72).

Figure 6:
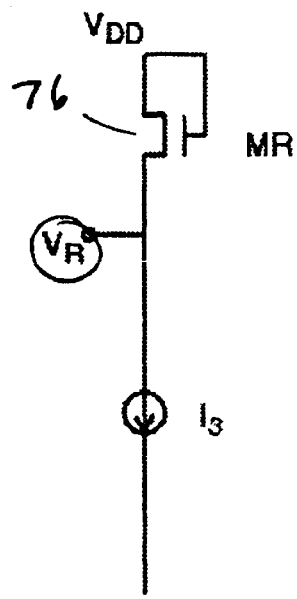
FIG. 6 shows a schematic drawing of a circuit for generating a reset voltage for the active pixel of FIG. 2.

The reset voltage $V_R$ (49) is $V_T-\Delta V$ below $V_{DD}$, and can be generated by a circuit shown in FIG. 6. $\Delta V$ is a positive voltage so that the reset transistor remains in subthreshold region. The size of transistor MR (76) and the current I3 is set in such way that it is biased in subthreshold region and $V_R=V_{DD}-(V_T-\Delta V)$.

Figure 7:
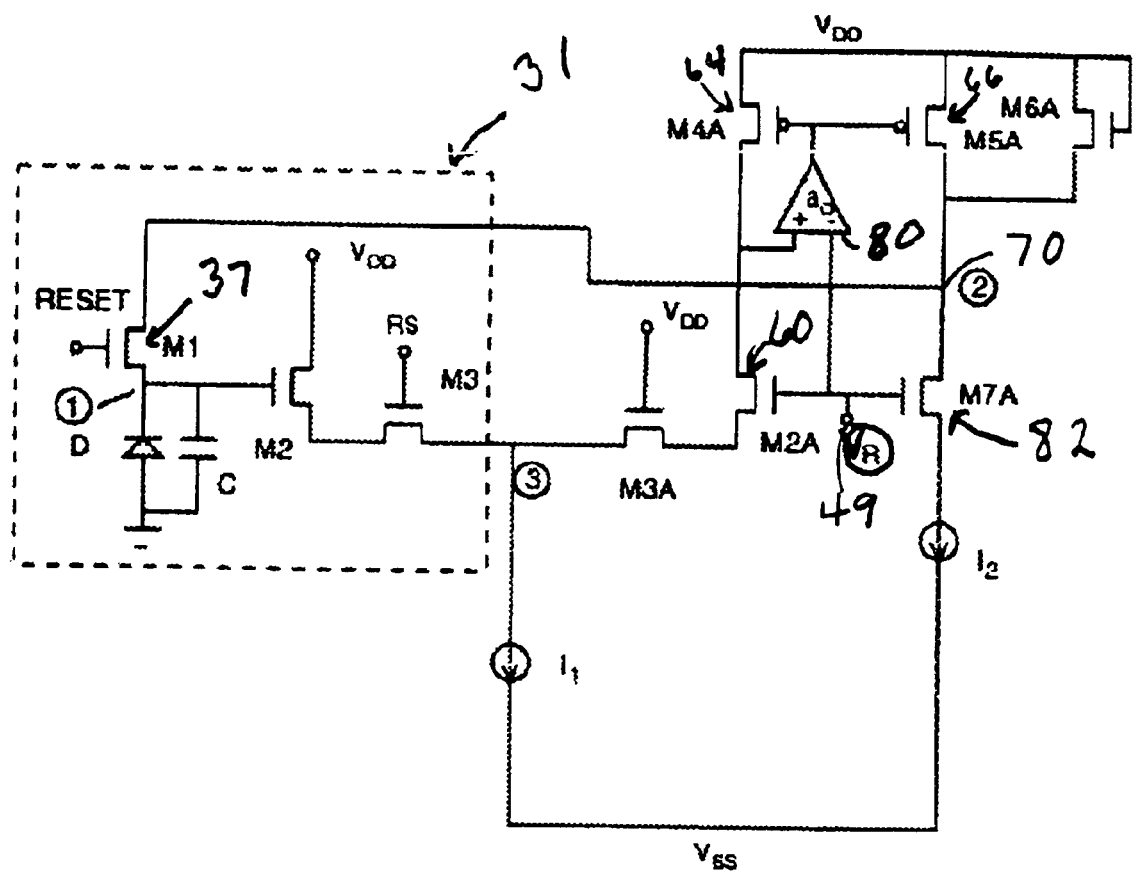
FIG. 7 shows a schematic drawing of second embodiment of the amplifier of the invention shown in FIG. 2.

A second embodiment of the amplifier A (33) is shown in FIG. 7. This embodiment includes an additional amplifier a. (80) and an NMOS transistor M7A (82). The amplifier $a_o$ (80) keeps the drain voltages of M2A (60) and M4A (64) at the reset voltage $V_R$ (49), so that the drain-to-source voltages of M4A (64) and M2A (60) are matched to that of M5A (66) and M7A (82), respectively. This improves the input referred offset voltage of the amplifier A (33). The transistor M6A (64) prevents Node 2 (70) from falling far below the reset voltage $V_R$ (49) during the transient. If the voltage on Node 2 (70) drops too far below $V_R$ (49), the drain-source resistance of the reset transistor M1 (37) is reduced. This causes the dominant pole frequency to go up potentially causing instability.

Figure 8:
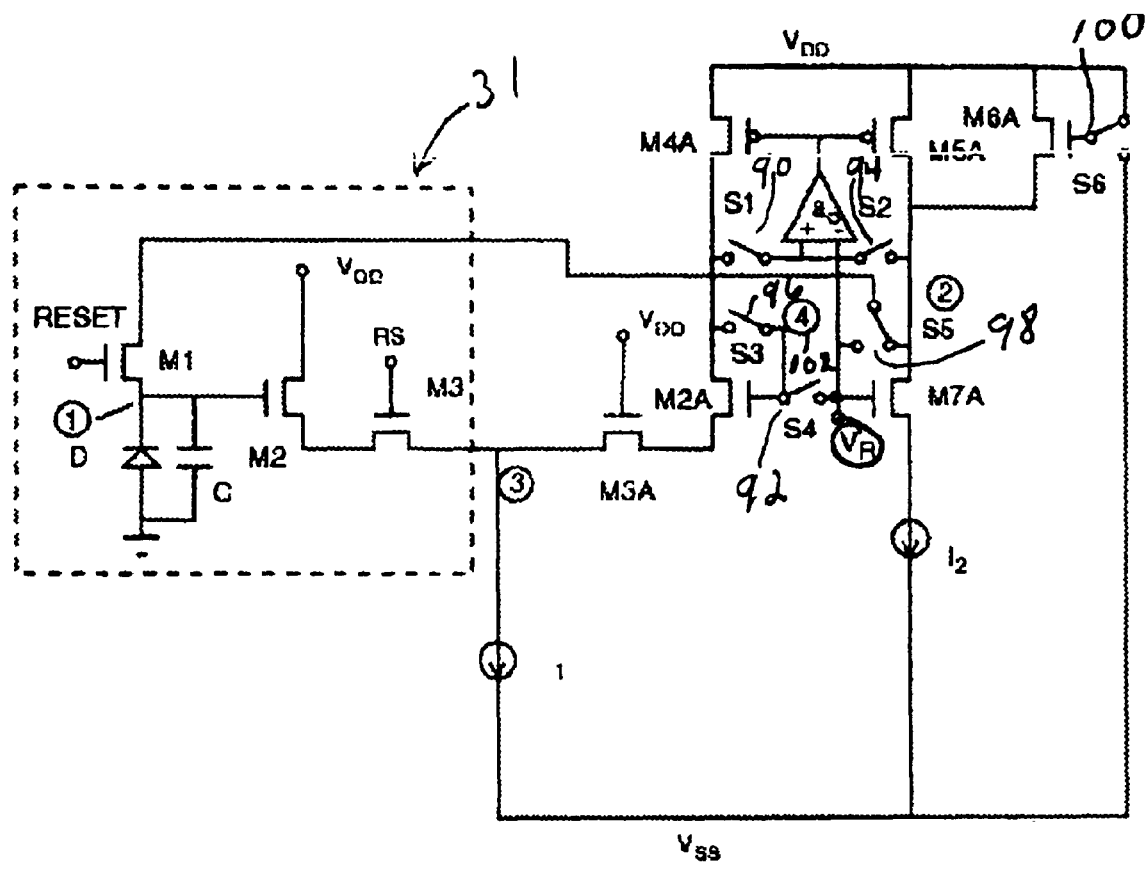
FIG. 8 shows a schematic drawing of a third embodiment of the amplifier of In the invention shown in FIG. 2.

FIG. 8 shows a third embodiment of the invention. In this embodiment, the amplifier is configured differently during the read phase so that it works as a unity-gain follower. During the reset phase, switches S1 (90) and S4 (92) are closed, S2 (94) and S3 (96) are open, S5 (98) in the right position, and S6 (100) in the up position. The circuit thus configured is identical to that in FIG. 7, and the reset is performed in the same manner. During the read phase, the switch positions are reversed, S1 (90) and S4 (92) are open, S2 (94) and S3 (96) are closed, S5 (98) in the left position, and S6 (100) in the down position. This configures the circuit into a unity-gain follower so that the output voltage at Node 4 (102) is a reproduction of the voltage on the sense node (Node 1 (38)). It can be shown that the offset voltage of the unity-gain follower configured in this manner is substantially the same as that during the reset mode. Since this offset voltage is already stored in the sense capacitor, the effect is automatically cancelled in a manner similar to standard offset cancellation.

While the preferred embodiments of the invention have been shown and described, numerous variations and alternative embodiments will occur to those skilled in the art. Accordingly, it is intended that the invention be limited only in terms of the appended claims.

I claim:

1. An image sensor comprising:
 a plurality of pixels each having an output, each pixel including:
  a first circuit that produces a signal proportional to incident light intensity, said first circuit being connected to supply said proportional signal to said pixel output,
  a select node connected to receive a select signal for selecting said pixel from said plurality of pixels, and
  a reset transistor for resetting said pixel; an amplifier having:
  a first input for receiving said outputs of said pixels, and
  an output connected to said pixels to be actively coupled to said reset transistors during a pixel reset phase to provide a negative feedback signal to a selected pixel during said pixel reset phase; and
 a reset reference voltage source connected to apply a reset reference voltage signal to said amplifier to provide a voltage reference for controlling reset of said pixels.

2. The image sensor of claim 1 wherein said amplifier further includes a second input receiving said reset reference voltage signal.

3. The image sensor of claim 2 wherein said reset transistor includes a gate and first and second terminals, said first terminal connected to receive said negative feedback signal to adjust said second terminal's voltage to a selected reset voltage.

4. The image sensor of claim 3 wherein said reset reference voltage source signal is selected to control said voltage at said second reset transistor terminal to be about $V_T-\Delta V$ below a reset voltage applied at said gate terminal of said reset transistor, where $V_T$ is a threshold voltage that is characteristic of said reset transistor, and $\Delta V$ is selected to maintain said reset transistor in a subthreshold region of operation during a steady state phase of pixel reset.

5. The image sensor of claim 4 wherein said selected $\Delta V$ is greater than about one hundred millivolts.

6. The image sensor of claim 4 wherein said select node of each said pixel comprises a terminal of a row select transistor that is coupled to said first input of said amplifier.

7. The image sensor of claim 6 wherein each said pixel further comprises a source follower transistor coupled between said second terminal of said reset transistor and a terminal of said row select transistor.

8. The image sensor of claim 3 wherein said first circuit comprises a photocircuit.

9. The image sensor of claim 8 wherein said amplifier comprises a differential amplifier including a first differential amplifier input transistor connected to receive said first amplifier input and a second differential amplifier input transistor connected to receive said second amplifier input, said first and second differential amplifier input transistors connected to provide a signal to a current mirror circuit that is connected to deliver said negative feedback signal to said reset transistor first terminal.

10. The image sensor of claim 8 wherein said photocircuit includes a photodiode and a capacitance.

11. The image sensor of claim 7 wherein said first circuit is a photocircuit.

12. The image sensor of claim 11 wherein said photocircuit includes a photodiode and a capacitance.

13. An image sensor array having rows and columns of pixels, comprising:
 at least one column line;
 a plurality of pixels each having an output, the outputs of pixels in a column being connected to a common respective column line, each said pixel including:
  a first circuit that produces a signal proportional to incident light intensity, said first circuit being connected to supply said proportional signal to said pixel output, and
  a reset transistor for resetting said pixel;
 at least one amplifier, each said amplifier having a first input coupled to at least one said column line, each said amplifier being connected to provide a negative feedback signal to each said pixel reset transistor of a respective column of pixels during each corresponding pixel reset phase; and
 a reset reference voltage source connected to apply a reset reference voltage signal to each said amplifier to provide a voltage reference for controlling reset of said pixels.

14. The image sensor of claim 13 wherein said amplifier further includes a second input for receiving said reset reference voltage signal.

15. The image sensor of claim 14 wherein said reset transistor includes a gate and first and second terminals, said first terminal connected to receive said negative feedback signal to adjust said second terminal's voltage to a selected reset voltage.

16. The image sensor of claim 15 wherein said reset reference voltage source signal is selected to control said voltage at said second reset transistor terminal to be about $V_T-\Delta V$ below a reset voltage applied at said gate terminal of said reset transistor, where $V_T$ is a threshold voltage that is characteristic of said reset transistor, and $\Delta V$ is selected to maintain said reset transistor in a subthreshold region of operation during a steady state phase of pixel reset.

17. The image sensor array of claim 16 wherein said selected $\Delta V$ is greater than about one hundred millivolts.

18. The image sensor array of claim 16 wherein each pixel comprises a row select transistor coupled between said second terminal of said reset transistor and said first input of said amplifier.

19. The image sensor array of claim 18 wherein each pixel further comprises a source follower transistor coupled between said second terminal of said reset transistor and a terminal of said row select transistor.

20. The image sensor array of claim 16 wherein said first circuit of each pixel comprises a photocircuit.

21. The image sensor array of claim 20 wherein said amplifier comprises a differential amplifier including a first differential amplifier input transistor connected to receive said first amplifier input and a second differential amplifier input transistor connected to receive said second amplifier input, said first and second differential amplifier input transistors connected to provide a signal to a current mirror circuit that is connected to deliver said negative feedback signal to said reset transistor first terminal.

22. The image sensor array of claim 20 wherein said photocircuit of each active pixel comprises a photodiode and a capacitance.

23. The image sensor array of claim 19 wherein each said first circuit comprises a photocircuit.

24. The image sensor array of claim 23 wherein each said photocircuit comprises a photodiode and a capacitance.

25. An image sensor array having rows and columns of pixels, comprising:
   at least one row line;
   a plurality of pixels each having an output, the outputs of pixels in a row being connected to a common respective row line, each said pixel including:
      a first circuit that produces a current proportional to incident light intensity, said first circuit being connected to supply said proportional current to said pixel output, and
      a reset transistor for resetting said pixel;
   at least one amplifier, each said amplifier having a first input coupled to at least one said row line, each said amplifier being connected to provide a negative feedback signal to each said pixel reset transistor of a respective row of pixels during each corresponding pixel reset phase; and
   a reset reference voltage source connected to apply a reset reference voltage signal to each said amplifier to provide a voltage reference for controlling reset of said pixels.

26. The image sensor of claim 25 wherein said amplifier further includes a second input for receiving said reset reference voltage signal.

27. The image sensor of claim 26 wherein said reset transistor includes a gate and first and second terminals, said first terminal connected to receive said negative feedback signal to adjust said second terminal's voltage to a selected reset voltage.

28. The CMOS image sensor of claim 27 wherein said reset reference voltage source signal is selected to control said voltage at said second terminal to be about $V_T-\Delta V$ below a reset voltage applied at said gate terminal of said reset transistor, where $V_T$ is a threshold voltage that is characteristic of said reset transistor, and $\Delta V$ is selected to maintain said reset transistor in a subthreshold region of operation during a steady state phase of pixel reset.

29. The image sensor array of claim 28 wherein said selected $\Delta V$ is greater than about one hundred millivolts.

30. The image sensor array of claim 28 wherein each pixel comprises a column select transistor coupled between said second terminal of said reset transistor and said first input of said amplifier.

31. The image sensor array of claim 30 wherein each pixel further comprises a source follower transistor coupled between said second terminal of said reset transistor and a terminal of said column select transistor.

32. The image sensor array of claim 28 wherein said first circuit of each pixel comprises a photocircuit.

33. The image sensor array of claim 32 wherein said amplifier comprises a differential amplifier including a first differential amplifier input transistor connected to receive said first amplifier input and a second differential amplifier input transistor connected to receive said second amplifier input, said first and second differential amplifier input transistors connected to provide a signal to a current mirror circuit that is connected to deliver said negative feedback signal to reset transistor first terminal.

34. The image sensor array of claim 32 wherein said photocircuit of each pixel comprises a photodiode and a capacitance.

35. The image sensor array of claim 31 wherein each said first circuit comprises a photocircuit.

36. The image sensor array of claim 35 wherein each said photocircuit comprises a photodiode and a capacitance.

37. The image sensor of claim 1 wherein said image sensor comprises a CMOS-compatible image sensor.

38. The image sensor array of either of claims 13 or 25 wherein said image sensor array comprises a CMOS-compatible image sensor array.

39. The image sensor of claim 1 wherein said pixels comprise active pixels.

40. The image sensor array or either of claims 13 or 25 wherein said pixels comprise active pixels.

* * * * *